United States Patent
Bahn et al.

(10) Patent No.: US 6,630,203 B2
(45) Date of Patent: Oct. 7, 2003

(54) ELECTROLESS PROCESS FOR THE PREPARATION OF PARTICLE ENHANCED ELECTRIC CONTACT SURFACES

(75) Inventors: Robert J. Bahn, Colarado Springs, CO (US); Fred A. Blum, Colorado Springs, CO (US); Herbert J. Neuhaus, Colorado Springs, CO (US); Bin Zou, Colorado Springs, CO (US)

(73) Assignee: NanoPierce Technologies, Inc., Denver, CO (US)

( * ) Notice: Subject to any disclaimer, the term of this patent is extended or adjusted under 35 U.S.C. 154(b) by 0 days.

(21) Appl. No.: 09/883,012

(22) Filed: Jun. 15, 2001

(65) Prior Publication Data

US 2002/0192363 A1 Dec. 19, 2002

(51) Int. Cl.⁷ .............................. B05D 3/10; B05D 1/18; B05D 5/12
(52) U.S. Cl. ........................ 427/304; 427/98; 427/123; 427/305; 427/437; 427/438; 427/443.1
(58) Field of Search .................... 427/98, 123, 304, 427/305, 437, 438, 443.1

(56) References Cited

U.S. PATENT DOCUMENTS

| | | | |
|---|---|---|---|
| 3,899,826 A | 8/1975 | Russ ........................... 29/583 |
| 4,744,850 A | 5/1988 | Imano et al. ................ 156/265 |
| 4,804,132 A | 2/1989 | Difrancesco ................ 228/115 |
| 5,083,697 A | * 1/1992 | Difrancesco ................ 228/116 |
| 5,334,306 A | * 8/1994 | Dautremont-Smith et al. ................. 205/118 |
| 5,334,809 A | 8/1994 | Difrancesco ................ 200/262 |
| 5,430,614 A | 7/1995 | Difrancesco ................ 361/785 |
| 5,471,151 A | * 11/1995 | DiFrancesco ............... 228/116 |
| 5,506,514 A | 4/1996 | Difrancesco ................ 324/757 |
| 5,565,280 A | 10/1996 | Difrancesco ................ 429/34 |
| 5,616,206 A | 4/1997 | Sakatsu et al. .............. 156/230 |
| 5,634,265 A | 6/1997 | Difrancesco ................ 29/825 |
| 5,642,055 A | 6/1997 | Difrancesco ................ 324/757 |
| 5,670,251 A | 9/1997 | Difrancesco ................ 428/325 |
| 5,702,763 A | * 12/1997 | Feldstein ..................... 205/109 |
| 5,835,359 A | 11/1998 | Difrancesco ................ 361/803 |
| 5,990,498 A | 11/1999 | Chapnik et al. ............. 257/99 |
| 6,018,167 A | 1/2000 | Oota ........................... 257/99 |
| 6,096,982 A | 8/2000 | Difrancesco ................ 174/268 |
| 6,156,390 A | * 12/2000 | Henry et al. ................ 427/122 |

OTHER PUBLICATIONS

I. Motizuke, et al., Preparation of Anisotropic Conductive Fine Particles by Electroless Nickel Plating, Trans IMF, 1999, pp 41–43.

Feldstein; Chapter 11, "Composite Electroless Plating; Electroless Plating", Fundamentals & Applications, Date Unknown, pp. 269–286.

Wernle, "Manufacturing of Low Cost Smart Label," presented at Internt'l Microelectronics Symposium, Oct. 2000, pp. 1–5.

Grosjean, et al., "Some Morphological Characteristics of the Incorporation of Silicon Carbide (SiC) Particles Into Electroless Nickel Deposits", Surface Coatings & Technology 130; 2000, pp. 252–256.

* cited by examiner

Primary Examiner—Michael Barr
(74) Attorney, Agent, or Firm—Dorsey & Whitney LLP

(57) ABSTRACT

The present invention provides a unique method for the electroless co-deposition of metal and hard particles on an electrical contact surface to provide electrical, thermal, and mechanical connections between the particle enhanced contact surface and an opposing contact surface, and to enhance the thermal and electrical conductivity between the contact surfaces and their corresponding substrates. The innovative method is able to uniformly deposit metal and particles of any shape, and with a wide range of density and sizes, on contact surfaces, and can be adjusted to provide any desired surface area coverage in desirable deposition patterns. The co-deposited contact surface can, for example, be easily joined to another surface of any type by nonconductive adhesive, resulting in a connection that is mechanically robust, chemically inert, and inherently electrically conductive.

20 Claims, 5 Drawing Sheets

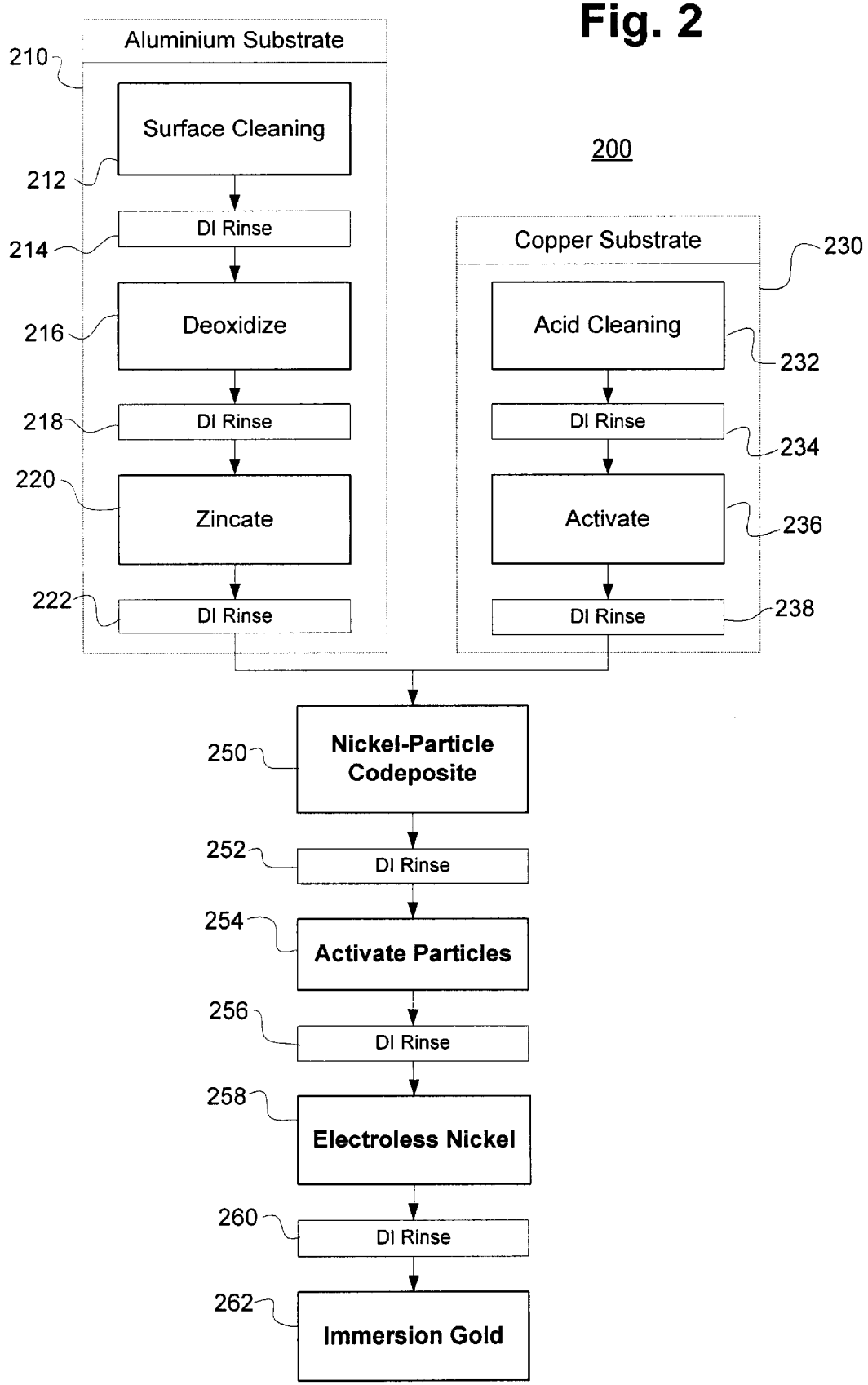

ELECTROLESS PROCESS FOR THE PREPARATION OF PARTICLE ENHANCED ELECTRIC CONTACT SURFACES

BACKGROUND OF THE INVENTION

1. Field of the Invention

This invention is related to electroless deposition processes and more specifically to methodologies for creating particle enhanced electric joining surfaces through modified electroless deposition processes.

2. Description of Related Art

Electroless nickel bumping (ENB) of contact surfaces is currently a primary technique for providing electrical, thermal, and mechanical connections for integrated circuit chips. The time required to bump a chip by electroless plating is governed by the rate of the metal deposition reaction and the desired height of the bump. Therefore, there is a practical limitation to the throughput of chips in the manufacturing process. Once a chip is bumped, several other steps are necessary to attach the chip to an opposing contact surface. First, oxidation on the opposing contact surface must be removed in order to provide a good electrical connection. Second, in order to attach a bumped chip to an opposing contact surface, the contact joint must be heated and the bumped chip either soldered to the opposing contact surface, or heated enough that the bump reflows to join the contact surface of the chip with the opposing contact surface. In the alternative, a conductive adhesive may be used to attach the bumped chip to the opposing contact surface. These additional steps needed to ensure a good electrical and mechanical connection inject added time and cost into the manufacturing process.

DiFrancesco in U.S. Pat. No. 5,083,697 originally disclosed particle enhancement of contact surfaces to provide improved electrical, thermal, and mechanical connections between contact surfaces. DiFrancesco suggested that the particle enhanced contact surfaces may be formed by employing a variety of techniques, such as electroplating, electroless plating, chemical vapor deposition (CVD), sputter deposition, and evaporation. Many of the methods suggested by DiFrancesco have practical disadvantages. For example, a major disadvantage of electroplating particles to enhance contact surfaces is that the method is not suitable if many electrically isolated contact surfaces are to be coated, for example, the contact surfaces of IC chips.

With particular references to electroless plating, DiFrancesco did not anticipate the following problems. First, metallized conductive particles are incompatible with an electroless plating solution, as metallized particles cause instant solution decomposition because of the large collective surface area of the metallized particles in plating solution. Second, direct deposition of nonconductive particles by conventional electroless plating methods is proven through experimentation to result in poor electrical conductivity because of poor metal coverage on the particles.

The plating of particulate matters onto metal surfaces and other substrates has been commonly practiced since 1960s. The aim of conventional composite electroless plating is to successfully co-deposit particulate matter in a metal film to create a new composite. These electroless composite processes are generally designed to provide a regenerated surface layer for the purpose of corrosion resistance or lubrication. In a conventional composite deposition, significant "mechanical" effort is devoted to ensure either a successful "inclusion" type of co-deposition of lubricating particles, such as PTFE and graphite fluoride, or a "structural" composite for the purpose of improving corrosion resistance of an electrodeposited structure. Therefore, most particles (95% or more of the deposited particles) in such composite depositions must be densely structurally implanted (without large "black-hole" type defects) in a metallic matrix film. These metal films must be of a certain thickness. Typically the thickness is of at least one order of magnitude greater than the average particle size, in order to achieve the anti-corrosion or lubricating benefits. The conventional electroless composite deposition process is not designed to provide an electrical or mechanical connection between two opposing surfaces, nor does it result in such benefits in actuality.

SUMMARY OF THE INVENTION

The present invention provides a unique method for co-depositing hard particles and metal on electrical contact surfaces to provide mechanical, thermal, and electrical connections between the contact surfaces, and to enhance the thermal and electrical conductivity between the contact surfaces and their corresponding substrates. The innovative method is able to uniformly deposit metal and particles of any shape, and with a wide range of density and sizes, on contact surfaces, and can be adjusted to provide any desired surface area coverage in desirable deposition patterns. The co-deposited contact surface can, for example, be easily joined to another surface of any type by nonconductive adhesive, resulting in a connection that is mechanically robust, chemically inert, and inherently electrically conductive. This eliminates the necessity of using specialized conductive adhesive or extreme heat for soldering or bump reflow for creating electrical surface joints.

In the relevant art, the term "substrate" is used interchangeably to indicate a wafer, an integrated circuit chip, a contact pad on a chip, a circuit board, and various other dielectric and conductive materials and surfaces. In order to avoid potential confusion, in this specification the term "contact surface" is used to indicate that portion of a substrate through which external electrical connections are made. A contact surface would therefore include the contact pads or area array contacts on a wafer, chip, or other substrate, but would not refer to the chip or wafer itself, or other elements thereof. While the embodiments discussed herein focus on the use of the inventive process to co-deposit metal and particles on contact surfaces, this is not meant to indicate any limitation of the process to such surfaces, and indeed the co-deposition process can be applied to other surfaces capable of accepting electroless plating as well.

The present invention consists of a modified two-step electroless metal plating process. The first plating step utilizes a modified composite electroless metal plating method to co-deposit metal and particles on a contact surface, wherein the preferred metal is nickel. A particle surface activation step is performed after the co-deposition to ensure adhesion of the metal to exposed particle surfaces during the second metal plating. At this time the first layer of metal may also be activated to achieve a more efficient metal deposition in the second plating process. The second plating step is a conventional electroless metal plating process, again preferably using nickel. The unique process disclosed herein is designed to produce a consistent and uniform dispersion of hard particles on a contact surface through modified electroless plating techniques. The deposits typically contain 5% to 50% by weight of occlusal hard particles, which uniformly cover the contact surface. Higher and lower surface density implantations of particles can be obtained to match any specific applications.

The second electroless metal plating step places a layer of metal film on the hard particles that have already been deposited by the first electroless metal-particle co-deposition process. The second metal layer does more than ensure the bonding strength the implanted particles need. More importantly, it also provides a conductive overcoat on the particles, which allows originally nonconductive particles to function as electrically conductive media. Without the second electroless metal plating, the metal and hard particle deposit of the first deposition often results in inferior electrical conductivity, since the metal coverage on the hard particle outcrops is often poor. Also, directly using conductive particles in an electroless metal deposition process can cause instant decomposition of the plating solution and particle deposition fails.

The disclosed two-step electroless metal plating process using the preferred metal, nickel, provides a uniform and less porous metal layer to most configurations of substrate. This provides a stronger bond for the particles and thereby a superior force enhancement for electric contact, i.e., less force is needed to establish conductivity when mounting a particle enhanced component because of the high force per unit area transferred to the particles, which embed in the contact surface.

The two-step electroless metal process proposed in the present invention also offers a much more uniform and desirable particle deposition pattern on contact surfaces. Because the particle deposition results from an electroless plating process, the particles are not subject to the influence of any electric fields, which is inevitable in an electrolytic co-deposition process. No particle treeing and little clustering is observed. As a result, generally uniform, single-layer hard particle deposition is achievable at little extra expense over a normal electroless plating process.

In actual application with common electrical components, the contact surfaces prepared by the present electroless metal-particle co-deposition process offer the following benefits over traditional metal bumping techniques and other particle enhancement techniques. First, the present invention is ideal for preparing semiconductor wafers for flip chip attachment. All the contact surfaces on the wafer can be treated in a single step without need for electrical bridging.

Second, the methodology provides for the application of nonconductive particles to create a conductive media. The second nickel-plating step deposits an overcoat on the nonconductive particles, which provides an electrical pathway between the joined contact surfaces. This essentially enables any type of hard particles compatible with electroless plating solutions to be used as contact surface joining media, especially a large selection of nonconductive particles, such as most ceramics, glasses, oxides, silicates, nitrides, and diamonds. Many particles in these categories are manufactured in other industries and are commercially available in large quantities and consistent quality. For instance, diamond powders are widely used as abrasive materials.

Third the electroless process results in a desirable contact surface with a designable particle deposition pattern. By a designable particle deposition pattern, it is meant that through the choice of particle material and size, particle concentration in the plating solution, and duration of the plating treatments, the height of the particle bump on the contact surface, the thickness of the metal coating on the particles, the surface density of the particles on the contact surface, and the thermal conductivity of the bond can all be controlled and modified to meet particular specifications for particular applications. For example, the two-step electroless metal-particle plating method enables the production of flat contact surfaces with single layer, well aligned, non-clustering, non-treeing, uniformly dispersed, particle patterns on the contact surfaces, which is ideal for contact surface joining and is suitable for wide applications, such as smart cards and LED arrays.

Fourth, the particle enhanced contact pads create improved electrical, mechanical, and thermal performances for surface electric connections. Two-step electroless nickel-particle plating, by nature, provides a denser and more mechanically robust co-deposition structure than, for example, electrolytic plating. The second nickel plating and immersion gold steps offer electrical pathways with a very low resistance. The particle-enhanced surfaces also provide exceptionally short circuit pathways aiding the low resistance of the electrical connections. Further, particle enhanced contact surfaces require neither solders nor conductive adhesives, which are often required by chips bumped by electroless nickel. Mechanically, the hard particles have the ability to pierce any nonconductive surface barrier, for example an oxide layer on either or both the co-deposited substrate and the opposing contact substrate, providing good electrical connection without the need for removal of the oxidation or other barrier. In addition, hard particles, such as diamonds, provide excellent thermal conductivity between joined surfaces. The improved thermal conductivity results because of the greater surface area provided by a multiplicity of rugged particles per bond site (typically 5 micron industrial diamond has a surface area of about 1 $m^2/g$) and higher coefficient of thermal conductivity for particles (typically around 10 W/cm/K for the industrial diamonds used) than typical bumped bonds. Altogether, the electroless co-deposition process offers perhaps the best combination of benefits available compared to current technology for joining electrical contact surfaces.

BRIEF DESCRIPTION OF THE DRAWINGS

FIG. 2 is a schematic diagram detailing the steps for a preferred embodiment of the metal and particle co-deposition process of the present invention.

DETAILED DESCRIPTION OF THE INVENTION

Figure 1A:
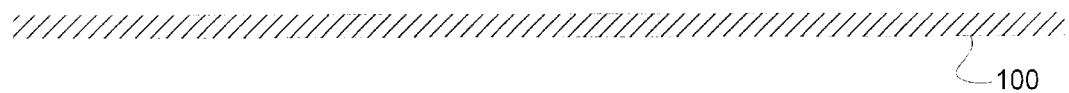
FIG. 1A is a cross section view of a contact surface before metal-particle deposition, depicting the first step in the series of the co-deposition process.
Figure 1B:
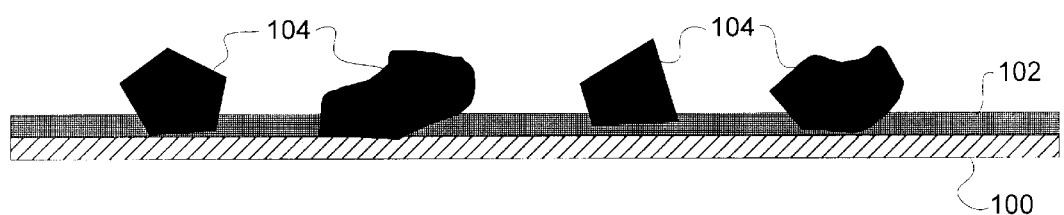
FIG. 1B is a cross section view of the contact surface of FIG. 1A with a metal-particle co-deposition layer, depicting the second step in the series of the co-deposition process.
Figure 1C:
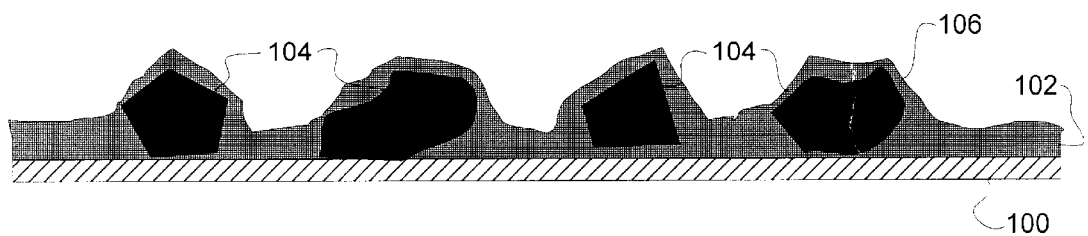
FIG. 1C is a cross section view of the contact surface of FIG. 1B with the addition of a second metal plated layer, depicting the third step in the series of the co-deposition process.
Figure 1D:
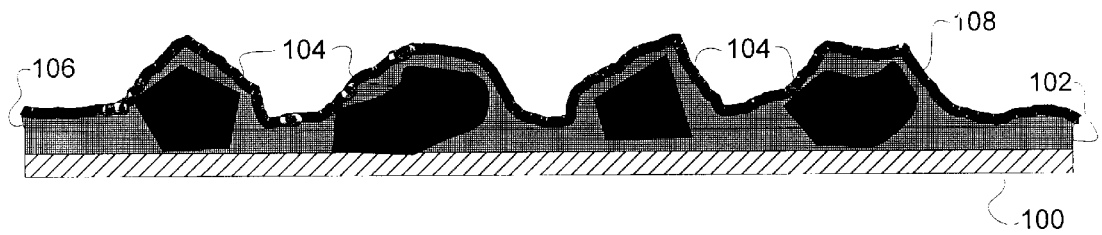
FIG. 1D is a cross section view of the contact surface of FIG. 1C with the addition of an immersion gold layer, depicting the fourth step in the series of the co-deposition process.

The present invention creates a co-deposited metal-particle surface for improved electric joining. Typically, the resulting surface made by the present method includes a co-deposited metal-particle layer, an overcoat of the same metal used in the prior co-deposition, and a thin layer of immersion gold. FIGS. 1A–1D schematically illustrate the evolution series of the inventive process. FIG. 1A shows an original, single, isolated contact surface 100, for example, of either a copper or aluminum substrate. FIG. 1B shows the resulting metal-particle co-deposition on the contact surface 100 plated by a first electroless metal-particle solution. The particles 104 are partially trapped and held on the contact surface 100 by the first metal layer 102 electrolessly deposited on the contact surface 100. FIG. 1C depicts the results of a second electroless metal plating step. A second metal layer 106 is deposited on the previously co-deposited first metal layer 102 and particles 104 on the contact surface 100. Generally, in order to cover the particles 104 with the second metal layer 106, the particles 104 must first be activated to accept the second electroless metal deposition. FIG. 1D shows a thin layer of gold overcoat 108 on the top of the second metal layer 106 by immersion gold. FIG. 1D represents the typical cross section of a plan view of a contact surface after being processed by the metal-particle co-deposition method of the present invention.

In contrast with prior art composite electroless plating processes, the purpose of the co-deposition process of the present invention is to form a unique conductive, sandpaper-like surface design and provide enhanced electrical contact and thermal transfer. Instead of serving as backbone for the dense inclusion of particulate matters in conventional composition deposition, the electroless metal-particle co-deposition of this invention functions more like glue, bonding the hard particles to the surface contacts. The particles are actually trapped in the metal deposition by happenstance of their location in solution. The process is able to generate a co-deposited metal-particle surface of any thickness, but a surface on the order of average particle size with a single-particle layer is preferred for optimized electrical, mechanical, and thermal connections.

The hard particles contemplated by the present invention may be selected from diamonds (polycrystalline or monocrystalline types), ceramics, metals, oxides, silicides, borides, silicates, nitrides, and various other compounds as long as the particle is harder than the applicable substrate contacts, so that it can preferably pierce into the substrate contacts. The particles that can be used in this process encompass a wide range of particle size and density. Preferably the particle size is from 0.5 to 50 microns, and the density ranges between 1.5 and 8 g/cm$^3$.

The contact surface prepared by the present invention can pierce any electric barriers on the contact surface itself and an opposing surface of any kind when the two surfaces are joined. Superior electrical conductivity can be provided without any additional steps, for example, soldering or reflow of metallized bumps of other methodologies. In one application of the invention, for example, the attachment of an IC chip to a substrate, a chip mount to a substrate using a chip with co-deposited particles on its contact surfaces can then be completed with a normal nonconductive adhesive to provide a stronger bond between the chip and the substrate, which eliminates the necessity of conductive adhesive underfill.

The schematic drawing shown in FIG. 2 illustrates the principles of a preferred embodiment of the invention. Conceptually, a comprehensive electroless co-deposition procedure 200 consists of surface preparation of substrate pads, modified electroless nickel-particle co-deposition, a second electroless nickel-plating, and immersion gold treatment. While nickel is the preferred metal for use in the metal-particle co-deposition process, other metals, such as cobalt, copper, iron, gold, silver, zinc, palladium, platinum, rhodium, and ruthenium, may be used with the appropriate electroless catalytic processes.

It is well known that good plating starts with proper surface preparation of the contact surfaces. A proper preparation is one whereby surface contamination is removed, which leaves a clean, oxide-free surface. Depending on the type of the contact surface and contaminations, different pretreatments are needed. Typically, surface contaminants that must be removed before plating include one or more of the following: organic contaminants (e.g., oils and lubricants), buffing compounds, oxide films, dirt, and fluxes.

In an embodiment wherein an aluminum contact surface is to be enhanced 210, the contact surface is first surface-cleaned 212 by alkaline cleaning solution followed with a deionized water rinse 214. The alkaline soak cleaning material may contain a mixture of alkaline sodium compounds such as hydroxides, carbonates, phosphates, and/or surfactants. The selection of cleaners can be adjusted according to the nature of the surface contamination. The alkaline cleaning can also include an organic chelating agent and/or sodium cyanide to accomplish surface cleaning and deoxidation simultaneously. However, a separate deoxidization process 216 using acid deoxidizers may also be used in this embodiment. It is believed that acid pickling using combined nitric acid (preferably 50% by volume) and ammonium bifluoride solution helps and benefits the initiation and activation of the contact surfaces for electroless plating. Practically, such a conditioning is desired in this embodiment to remove alloying elements from the substrate surface and to prepare it for uniform zincating. This step may be performed by immersion in strong nitric-acid based solution. Reaction with nitric acid forms a thin, light, uniform oxide film, on the aluminum contact surface that protects it from further attack by the acid. A subsequent zincating process easily removes this film. For wafers that may contain a high percentage of silicon, hydrofluoric acid or fluorides may be added to the nitric acid to dissolve silicon.

Residues from cleaners and deoxidizers can increase the porosity of an electroless nickel plate by creating passive spots on the contact surfaces that will not initiate electroless plating. This in turn creates deposition problems for hard particles. Therefore, in this embodiment a deionized water rinse 218 is a preferred step after deoxidizing, and good rinses are desirable throughout the process of this embodiment. After rinsing, the contact surfaces normally should be dried at an appropriate temperature, i.e., a drying temperature should be chosen according to the type of substrate housing the contact surfaces such that the temperature is not deleterious to the substrate.

Following deoxidization, zincating 220, a process wherein an intermediate molecular zinc layer replaces the surface aluminum on the contact surface, is a common step to protect the deoxidized, active aluminum surface from reoxidation during any transfer and from potential direct reaction with an electroless nickel solution. The zinc layer further catalyzes the electroless nickel deposition. Proprietary zincate solution, for example, Fidelity 3116 (Fidelity Chemical, Newark, N.J.), is used for zincation in this embodiment. As an alternative embodiment, a double zincating procedure is also considered in the invention. In such a process, the initial zinc layer is removed by a dip in 50% nitric acid, and a second zinc layer is deposited by a short immersion in the zincate solution. The benefits of this treatment come from the use of a less critical first zincating step to deoxidize the contact surface and remove alloying inclusions, while the second zincating treatment can be adjusted to produce a thin, tight zinc deposit on the uniformly conditioned contact surface. However, such a double zincating process normally requires a thicker aluminum contact surface, typically greater than 1000 nanometers.

In another embodiment, a substrate with copper contact surfaces 230 may be used. The surface treatment for electroless particle enhancement of copper contact surfaces is different from that for aluminum. First the copper contact surfaces are cleaned by using acidic solutions 232. An ATO Tech AFR2 (Berlin, Germany) system may be used for surface cleaning, followed by thorough rinsing with deionized water 234. Copper is a metal that will not catalytically initiate hypophosphite electroless nickel solution, which represents the chemistry of another Fidelity propriety system (Fidelity 9002) that may be used in the electroless nickel solution of the described embodiments. To render copper catalytic, one of the commercially available approaches is to activate each contact surface 236 as a catalyst by immersion in dilute palladium chloride solutions. In this embodiment, Fidelity 9025 propriety solution may be used, but any applicable chemical systems can be utilized without significant effects on the other steps in the process. The catalyzed copper is again rinsed in deionized water 238.

Electroless nickel-particle co-deposition is the focus of the invention. Micron-sized hard particles are plated on the contact surfaces by electroless nickel-particle co-deposition 250. Particles are introduced to an electroless nickel solution, in one embodiment, Fidelity 9002 proprietary solution, at a desired particle concentration. The concentration is somewhat dependent on what particle population density is expected on the deposited surface, but typically is on the level of 1 g/L. Preferably, the electroless co-deposition method plates a single-layer of sparsely, yet uniformly dispersed, narrow-banded (i.e., the distribution of or variation between particle size or diameter is very small), hard particles on the contact surfaces of the substrate. For best surface joining, the resulting metal layer on the areas of the contact surfaces not covered by particles after co-deposition ideally should be flat with no surface concavity. This preferred single layer and fairly uniformly dispersed particle deposition design offers both the shortest electrical pathway via excellent conductive nickel and gold overcoats on the hard particles, and the best thermal conductive media because of the excellent thermal conductivity coefficient of the hard particles, for example diamond particles.

Preparation of the particles co-deposited on the contact surfaces is desirable before the second electroless nickel-plating step. After a deionized water rinse 252 following the co-deposition process step, activation of the surfaces of the particles 254, for example through the use of a catalyst, is preferred to achieve a consistent and comprehensive nickel coat over the particles during the second nickel plating treatment. Poor activation at this stage can cause lack of adhesion of nickel to the deposited diamond particles and porous nickel deposition with poor conductivity. One solution that can be used for the particle activation is the Fidelity 9025 solution, also used to catalyze a copper contact surface as described above. After activation, the plated contact surfaces are rinsed in deionized water 256.

The purpose of the second electroless nickel plating step 258 is to cast a thin nickel layer to the co-deposited nickel-particle surface. The second nickel plating solution, in one embodiment, Fidelity 9002 proprietary solution, is not charged with any type of particles. The nickel cast provides a conductive metal overcoat on the deposited nonconductive particles. Good nickel coverage provides a good gold layer by the following immersion gold process, and therefore better overall electrical conductivity for the joining surfaces. The chemical system used in this step may be the same as that used in the first electroless nickel solution except for the particles. The substrate with the nickel-particle plate is again rinsed in deionized water 260 after the second nickel plating treatment.

Immersion gold is a typical finishing step 262. The process differs from the autocatalytic nickel plating in both its mechanisms and its results. An immersion gold process actually replaces nickel molecules on the surface of the second nickel plate for gold molecules, resulting in a thin gold layer. Oromerse MN (Technic, Inc., Cranston, R.I.) proprietary solution may be used. While the second nickel plating provides a conductive pathway and the robust mechanical bonding strength to secure the particles to the substrate, a finish layer of dense immersion gold ensures persistent protection from surface degradation and excellent electric conductivity over a long period of time.

Experimental Testing

Extensive experiments performing the metal-particle co-deposition process have been conducted at NanoPierce Technologies in Colorado Springs, Colo. and NanoPierce Card Technologies, GmbH in Munich, Germany. Test wafers with contact pads of aluminum and copper substrates have been plated with various particles according to the processes developed in the present invention.

Figure 3:
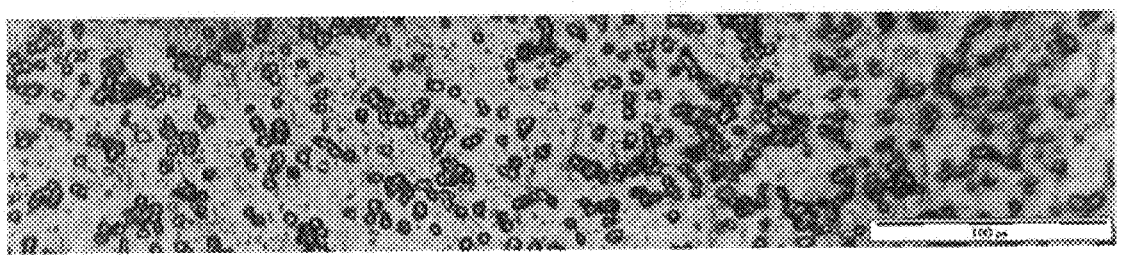
FIG. 3 is a microscopic photograph of a top view of a diamond-nickel co-deposition surface with gold finish prepared according to the process of the present invention.

FIG. 3 shows a microscopic top view of a diamond-nickel co-deposit surface on copper substrate with gold finishing. The scale depicted in FIG. 3 indicates 100 $\mu$m. The process was performed precisely following the procedure described above. The plating solution used was Fidelity 9002. The plating solution contained virgin diamonds (Amplex™ RB premium virgin diamond powder) at a concentration of 1 g/L. The size of the diamonds used was between 4 and 6 microns. The wafer was plated in the first step electroless nickel-diamond solution for 3 minutes. The plating temperature was 190° F. Moderate mechanical agitation was applied by magnetic stirring. Varying the plating time in the second electroless nickel solution can control the thickness of the overcoat. Although the thickness of the gold plated nickel film over the particles was not measured, it was estimated to be around 1 micron, wherein the thickness of immersion gold layer is only 0.1 to 0.2 micron. The surface density of the particles deposited on the copper substrate is estimated to be 40%. This density can be controlled to result at almost any percentage to meet any specification. Although the contact resistance is to yet be measured, it is expected to be at a very low level due to the excellent gold coverage on the particles as indicated by the comprehensive gold overcoat shown in FIG. 3.

Figure 4:
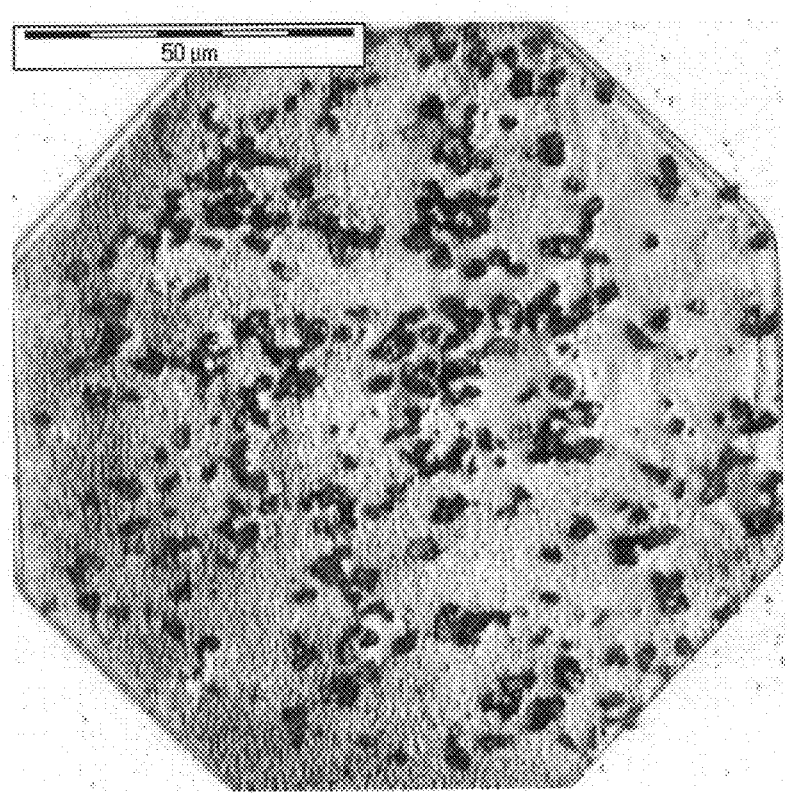
FIG. 4 is a microscopic photograph of a top view of a diamond-nickel co-deposition surface on an aluminum substrate prepared according to the process of the present invention.
Figure 5:
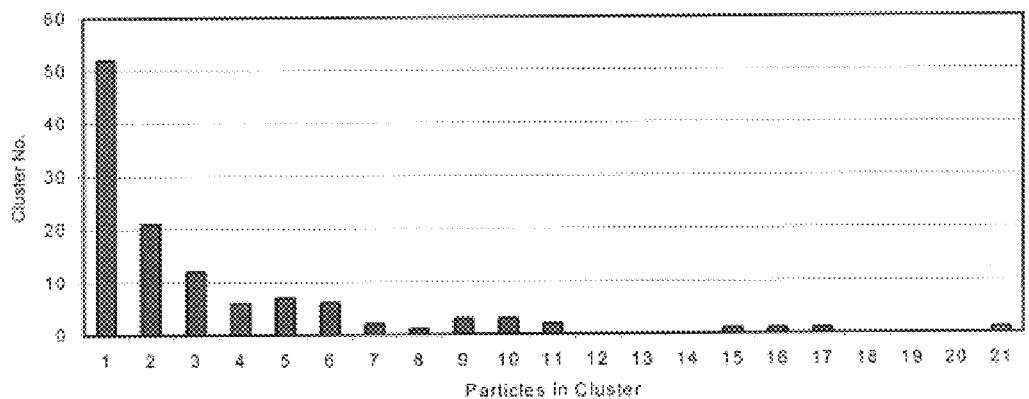
FIG. 5 is a statistical graph for particle cluster size distribution of a diamond-nickel co-deposition surface prepared according to the process of the present invention.

Co-deposition was also tested using smaller particles on an aluminum contact substrate. FIG. 4 shows a microscopic top view of a diamond-nickel co-deposited surface on aluminum substrate without the gold finishing. The scale in this example indicates 50 µm. The plating solution used was also Fidelity 9002. The first plating solution again contained 1 g/L of virgin diamonds (Amplex™ RB premium virgin diamond powder). The average size of the diamonds was only 3 microns. The wafer was plated in the first electroless nickel-diamond solution for 3 minutes. The plating temperature was 190° F. The desirable sandpaper like surface co-deposition was achieved. An advanced image processing technique (Scion Image®, based on the original public domain National Institute of Health image particle processing software) was used to analyze the surface. The coverage of the diamond particles on the surface was measured to be 23.5%. The statistics for particle cluster size and distribution are shown in FIG. 5. The result indicates that most diamond particles were deposited on the surface in instances of single particles or small clusters.

Figure 6:
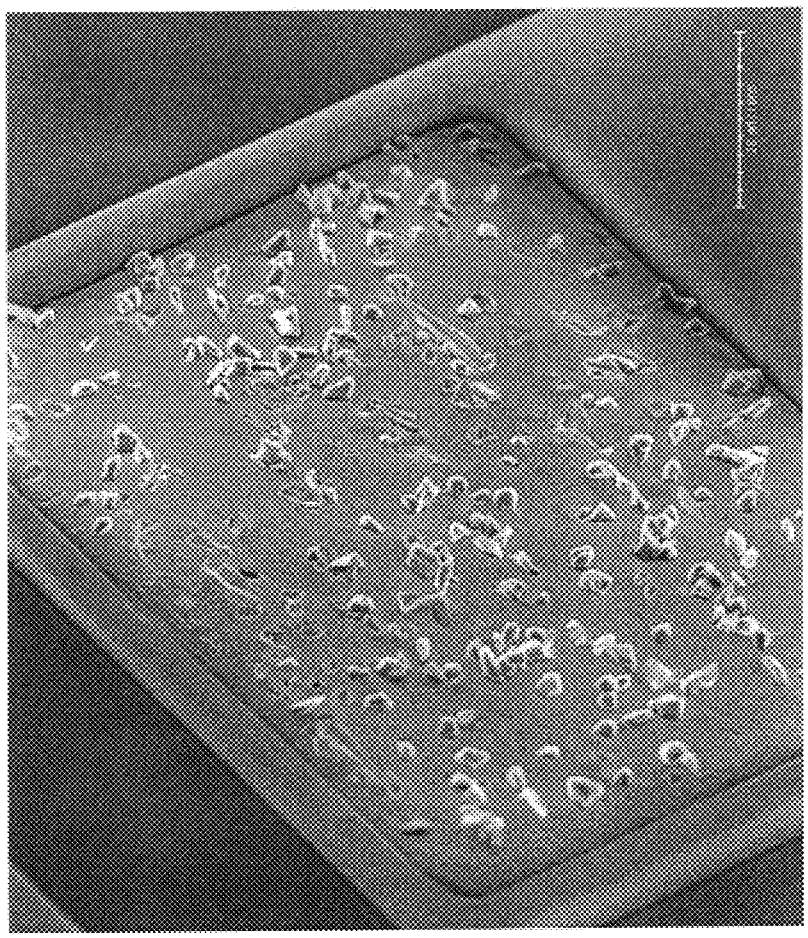
FIG. 6 is a scanning electron microscope photograph showing a microscopic perspective view of a nickel-diamond co-deposition on an aluminum substrate prepared according to the process of the present invention.

FIG. 6 shows a scanning electron microscope (SEM) photograph for a nickel-diamond co-deposition on an aluminum substrate. The scale indicates a length of 20 µm. The plating solutions and conditions, substrate, and particles used were exactly the same as used in the example of FIG. 4, although in this instance the shape of the test wafer was rectangular instead of octagonal. In this experiment, a single layer of particles was deposited on a tiny flat surface (50×80 microns), which makes an excellent pad readily available for surface joining. FIG. 6 also shows a perfect macroscopic surface flatness of the nickel and an even, single-layer particle distribution after electroless nickel-diamond co-deposition. This manifests one clear advantage of using electroless nickel plating over, for example, electrolytic co-deposition—the electrolytic method often results in a huge concavity of the metal plated on a tiny surface because of the significant edge effects of the electric field, whereas the electroless method does not.

Figure 7:
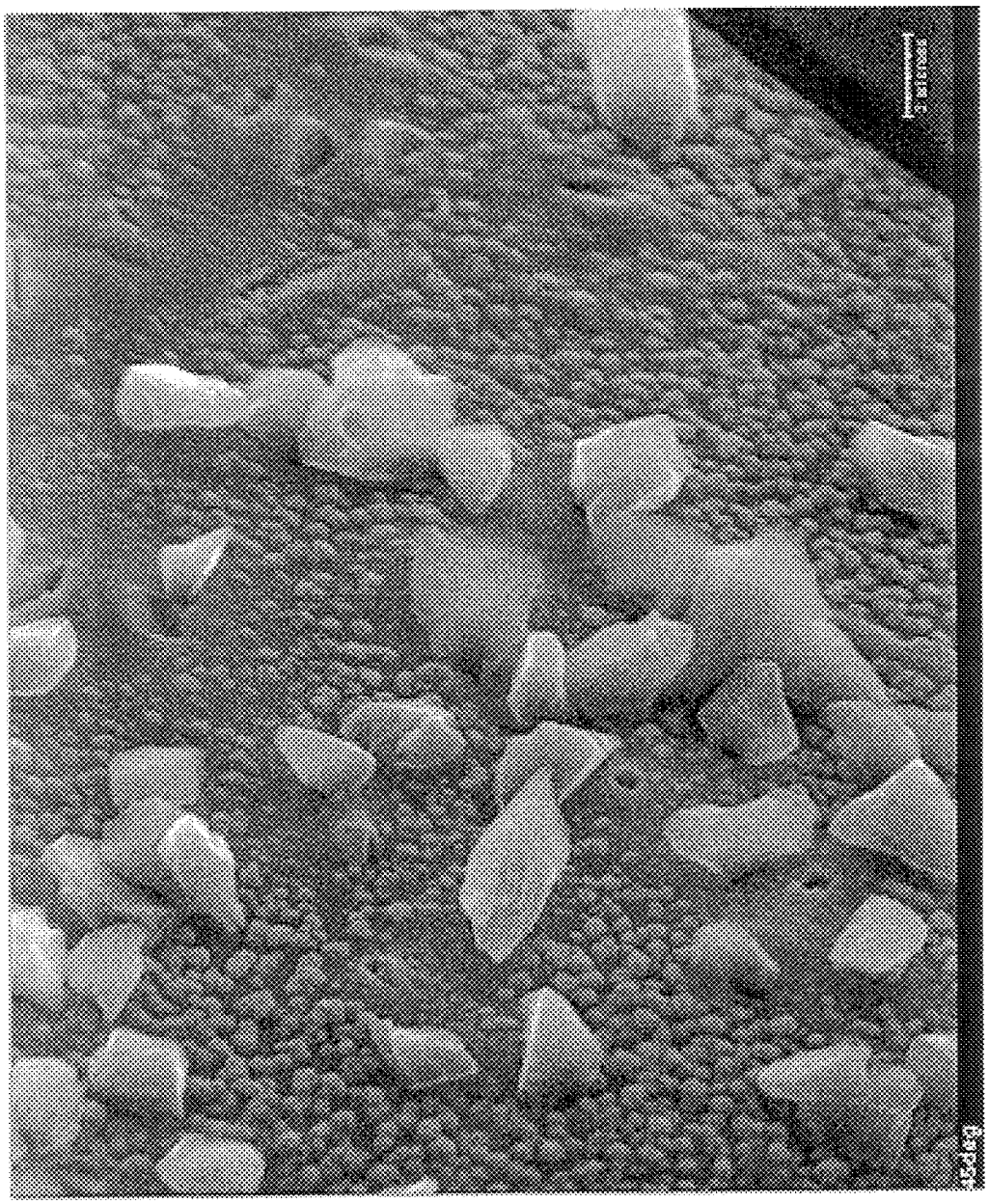
FIG. 7 is a scanning electron microscope photograph showing a microscopic perspective view of a nickel-diamond co-deposition prepared according to the process of the present invention without the second electroless nickel plating layer.

FIG. 7 presents an even closer inspection of an electroless nickel-diamond co-deposit surface on aluminum contact substrate. The scale on the upper-right corner of the photograph is 2 µm. This SEM photograph was taken of a surface that was prepared using only the first electroless nickel-diamond co-deposition process without the further plating steps. As can be seen, most of the diamonds, with an average size of 3 microns, have only a small portion of their body embedded in the nickel deposition. The desired single layer, uniform distribution of the particles on the contact substrate is also very apparent. The FIG. 7 photograph also indicates that very little nickel covered the surfaces of the particles, which implies that poor electrical conductivity through the particles will consequently result if the second electroless nickel plating step is ignored. This also is indicative that the diamond particles remain uncoated by the nickel in the solution before they are deposited to the wafer surface; otherwise instant solution decomposition would likely occur because of the great surface area of the particles.

In summary, the above experiments clearly demonstrate that the two-step electroless metal-particle co-deposition process offers a unique method to make an electric joining surface with superior electrical, thermal, and mechanical properties.

Although various embodiments of this invention have been described above with a certain degree of particularity, or with reference to one or more embodiments, those skilled in the art could make numerous alterations to the disclosed embodiments without departing from the spirit or scope of this invention. It is intended that all matter contained in the above description and shown in the accompanying drawings shall be interpreted as illustrative only and not limiting. Changes in detail or structure may be made without departing from the spirit and scope of the invention as defined in the following claims.

What is claimed is:

1. A method for enhancing at least one electrical contact surface to provide an improved electrical, thermal, and/or mechanical connection with at least one opposing electrical contact surface, the method comprising:

co-depositing a first layer of a first metal and at least one particle on the at least one electrical contact surface by electroless deposition, wherein the at least one particle is trapped by the deposition of the first metal on the at least one electrical contact surface;

activating the at least one particle to accept a deposition of a second layer of a second metal; and depositing the second layer of the second metal over the at least one particle by electroless deposition.

2. A method as described in claim 1 wherein the at least one particle comprises a plurality of particles.

3. A method as described in claim 1 further comprising depositing a layer of gold over the second layer of the second metal.

4. A method as described in claim 3 wherein the gold is deposited by an immersion gold process.

5. A method as described in claim 1 wherein the first metal comprises at least one of the following substances: nickel, cobalt, copper, iron, gold, silver, zinc, palladium, platinum, rhodium, and ruthenium.

6. A method as described in claim 1 wherein the second metal comprises at least one of the following substances: nickel, cobalt, copper, iron, gold, silver, zinc, palladium, platinum, rhodium, and ruthenium.

7. A method as described in claim 1 wherein the second metal comprises the same metal as the first metal.

8. A method as described in claim 1 wherein the at least one particle is a nonconductive particle comprising at least one of the following substances: ceramics, glasses, metals, oxides, silicates, suicides, borides, nitrides, and diamonds.

9. A method as described in claim 1 or claim 8 wherein the at least one particle comprises a hard particle capable of piercing the electrical contact surface.

10. A method as described in claim 1 or claim 8 wherein the at least one particle comprises a hard particle capable of piercing the opposing electrical contact surface.

11. A method as described in claim 1 wherein the at least one electrical contact surface comprises a contact pad of an integrated circuit chip.

12. A method as described in claim 1 wherein the at least one electrical contact surface comprises a plurality of discrete electrical contact surfaces.

13. A method as described in claim 12 wherein the surfaces of the plurality of discrete electrical contact surfaces are electrically insulated from each other.

14. A method as described in claim 12 wherein the plurality of discrete electrical contact surfaces comprises an area array contact configuration of an integrated circuit chip.

15. A method as described in claim 12 wherein the plurality of discrete electrical contact surfaces comprises a plurality of contact surfaces on an integrated circuit wafer.

16. A method as described in claim 1 wherein the at least one particle comprises a plurality of particles and the step of co-depositing comprises depositing the plurality of particles in a single, uniformly dispersed layer on the at least one contact surface.

17. A method for enhancing an electrical contact surface to provide an improved electrical, thermal, and/or mechanical connection with an opposing electrical contact surface, the method comprising:

co-depositing a first layer of nickel and a plurality of diamond particles on the electrical contact surface by electroless deposition, wherein the plurality of diamond particles is deposited in a single, uniformly dispersed layer, and the plurality of diamond particles is trapped by the deposition of the first layer of nickel on the electrical contact surface;

activating the plurality of diamond particles to accept a deposition of a second layer of nickel; and depositing the second layer of nickel over the plurality of diamond particles by electroless deposition.

18. A method as described in claim 17 further comprising depositing a layer of immersion gold over the second layer of nickel.

19. A method as described in claim 17, wherein the electrical contact surface comprises a contact pad of an integrated circuit chip.

20. A method as described in claim 19 wherein the contact pad is one of a plurality of contact pads of the integrated circuit chip and the contact pad is electrically isolated from any other of the plurality of contact pads of the integrated circuit chip.

* * * * *